US010042700B2

(12) United States Patent
Brandl

(10) Patent No.: US 10,042,700 B2
(45) Date of Patent: Aug. 7, 2018

(54) INTEGRAL POST PACKAGE REPAIR

(71) Applicant: Advanced Micro Devices, Inc., Sunnyvale, CA (US)

(72) Inventor: Kevin M. Brandl, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 136 days.

(21) Appl. No.: 15/168,045

(22) Filed: May 28, 2016

(65) Prior Publication Data

US 2017/0344421 A1 Nov. 30, 2017

(51) Int. Cl.
*G11C 29/00* (2006.01)
*G06F 11/10* (2006.01)
*G06F 3/06* (2006.01)
*G11C 29/52* (2006.01)

(52) U.S. Cl.
CPC .......... *G06F 11/1068* (2013.01); *G06F 3/064* (2013.01); *G06F 3/0619* (2013.01); *G06F 3/0673* (2013.01); *G11C 29/52* (2013.01)

(58) Field of Classification Search
CPC .... G06F 11/1068; G06F 3/0673; G06F 3/064; G06F 3/0619; G06F 11/1044; G06F 5/065; G06F 11/076; G06F 3/061; G06F 3/0658; G06F 3/0659; G06F 3/0688; G06F 3/0679; G06F 3/0626; G06F 3/0653; G11C 29/52; G11C 29/44; G11C 29/50004; G11C 2029/5004

See application file for complete search history.

(56) References Cited

U.S. PATENT DOCUMENTS

| | | |
|---|---|---|
| 6,718,444 B1 | 4/2004 | Hughes |
| 6,848,063 B2 | 1/2005 | Rodeheffer et al. |
| 7,043,679 B1 | 5/2006 | Keltcher |
| 7,236,269 B2 | 7/2007 | Hamilton |
| 7,386,771 B2 | 6/2008 | Shuma |
| 7,600,165 B2 | 10/2009 | Chih |

(Continued)

OTHER PUBLICATIONS

European Search Report for EPO Application No. EP16204136, dated Jun. 29, 2017, 4 pages.

(Continued)

*Primary Examiner* — Guerrier Merant
(74) *Attorney, Agent, or Firm* — Polansky & Associates, P.L.L.C.; Paul J. Polansky

(57) ABSTRACT

A post-package repair system includes a memory channel controller, a first error counter, a scrubber, and a data processor. The memory channel controller converts data access requests to corresponding memory accesses, and provides returned data to the host interface in response to responses received from a memory interface, wherein the responses comprise returned data and a plurality of error correcting code (ECC) bits. The first error counter counts errors in the returned data, and provides a control signal in response to reaching a predetermined state. The scrubber controls the memory channel controller to read data sequentially and periodically from a plurality of addresses of a memory system, and in response to detecting a correctable error, to rewrite corrected data. The data processor is responsive to the control signal to perform a post package repair operation with the memory system in response to the control signal.

22 Claims, 7 Drawing Sheets

(56) References Cited

U.S. PATENT DOCUMENTS

| | | | |
|---|---|---|---|
| 8,255,772 B1 | 8/2012 | Foley | |
| 9,003,102 B2* | 4/2015 | Lassa | G06F 3/061 |
| | | | 711/103 |
| 9,146,811 B2 | 9/2015 | LaBerge et al. | |
| 2006/0212778 A1 | 9/2006 | Wheeler et al. | |
| 2007/0089032 A1 | 4/2007 | Alexander et al. | |
| 2012/0317352 A1 | 12/2012 | Kang et al. | |
| 2013/0139008 A1 | 5/2013 | Kalyanasundharam | |
| 2014/0192583 A1* | 7/2014 | Rajan | G11C 7/10 |
| | | | 365/63 |
| 2017/0123660 A1* | 5/2017 | Camp | G06F 3/061 |
| 2017/0139761 A1* | 5/2017 | Song | G06F 11/079 |
| 2017/0192843 A1* | 7/2017 | Warnes | G06F 11/1044 |

OTHER PUBLICATIONS

International Search Report and Written Opinion for International Application No. PCT/US2016/053138, dated Feb. 22, 2017, 12 pages.

DDR4 SDRAM, MT40A1G4, MT40A512M8, MT40A256M16 Data Sheet, Rev. D, (c) Micron 2014, 355 pages.

\* cited by examiner

INTEGRAL POST PACKAGE REPAIR

FIELD

This disclosure relates generally to data processing systems, and more specifically to data processing systems with high reliability memory.

BACKGROUND

Modern dynamic random access memory (DRAM) is used in most personal computer systems and servers today due to its low cost, high density, and random access times. DRAMs are based on small memory cells that store charge in capacitors to indicate the state of the memory cell. Capacitive storage is dynamic and the capacitors lose their charge over time. Thus the memory cells have to be periodically refreshed. In addition, a read operation is destructive because it drains the charge on the capacitor. Before an access to a memory location on a particular row, the row is "activated" by storing the contents of the row in a large page buffer that may be, for example, eight kilobytes (8 kB) in size. Before reading or writing a memory location in another row, the memory row currently in the page buffer must be "precharged" by rewriting the page buffer contents back into the memory cells along the row, which charges the capacitors back to their original states.

Because of their small size, DRAM memory cells are susceptible to soft errors. A soft error is a data error caused by the occurrence of a random electrical event, such as an alpha particle passing through the capacitor, electromagnetic interference, etc. Thus a soft error does not reflect any fundamental error or defect in the circuitry. In order to correct soft errors, memory manufacturers have adopted so-called error correcting codes (ECCs), usually by including one extra DRAM chip for each set of eight DRAM chips. ECCs are extra bits stored with the data that can allow, for example, the correction of a single bit error out of a group of bits, and the detection, but not correction, of a multiple-bit error. ECC allows correction of a single bit error because the ECC code contains enough information to identify the location of the failing bit so that the logic state can be inverted before the bit is rewritten to the memory array during a subsequent precharge operation.

Detection of soft errors using ECC bits is difficult in real time during read or write accesses. Thus memory controllers sometimes use "scrubbers" to perform background inspection of memory cells for soft errors. A scrubber periodically inspects a line of memory for ECC errors. If the scrubber finds a correctable error, it corrects the error, thereby decreasing the probability that the error would occur during an actual read or write access. The scrubber checks all memory locations in the entire physical memory space for such errors on a periodic basis, such as once per day.

On the other hand, memory cells occasionally experience circuit defects or "hard" errors that get worse over time until the memory cell or a set of adjacent memory cells fail. Conventionally DRAMs are tested at the factory to detect hard errors and are corrected by substituting redundant rows or columns for the failing rows or columns. However detection and correction of memory cells that become defective after manufacturing becomes more difficult. Typically memory is tested for hard errors at startup and the portion of memory that has experienced a hard error is removed from the system memory map. However if a hard error occurs after startup, running programs may crash, causing inconvenience or loss of data for the user. Moreover there are no known strategies to detect and correct hard errors that develop slowly over time and that do not result in program failure or lost data because of the availability of ECC bits.

In order to correct hard errors that arise after factory test, the double data rate version four (DDR4) memory specified by the Joint Electron Devices Engineering Council (JEDEC) has adopted a feature known as post-package repair. However there are no known systems able to use the post-package repair feature to correct hard errors simply and efficiently and prior to program failure or loss of data.

Figure 1:
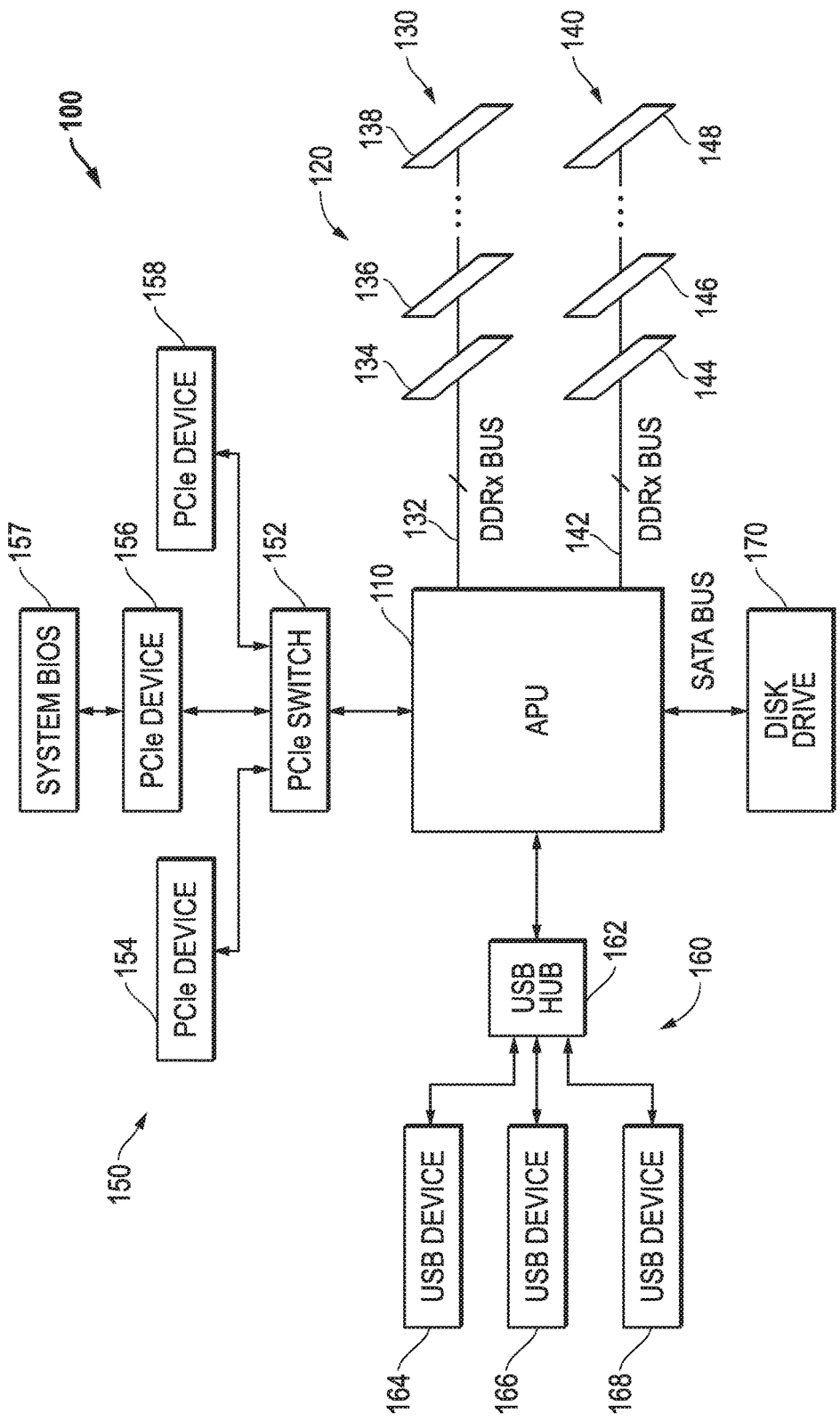
FIG. 1 illustrates in block diagram form a data processing system according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

As will be described below in one form, a post-package repair system includes a memory channel controller, a scrubber, a first error counter, and a data processor. The memory channel controller converts data access requests received from a host interface to corresponding memory accesses provided to a memory interface, and provides returned data to the host interface in response to responses received from the memory interface, wherein the responses comprise returned data and a plurality of error correcting code (ECC) bits. The first error counter is coupled to the memory channel controller and counts errors in the returned data, and provides a control signal in response to reaching a predetermined state. The scrubber is coupled to the memory channel controller for controlling the memory channel controller to read data sequentially and periodically from a plurality of addresses of a memory system, and in response to detecting a correctable error, to rewrite corrected data. The data processor is coupled to the memory channel controller and is responsive to the control signal to perform a post package repair operation with the memory system in response to the control signal.

In another form, a memory controller is suitable for use in a system that performs post-package repair on a memory system. The memory controller comprises a memory channel controller and a first error counter. The memory channel controller converts data access requests received from a host interface to corresponding memory accesses on a memory interface, and provides returned data to the host interface in response to responses received from the memory interface. The responses comprise returned data and a plurality of error correcting code (ECC) bits. The memory channel controller detects an error in the returned data by performing an error check based on the plurality of error correcting code (ECC) bits corresponding to the returned data, and provides a count signal in response to detecting the error in the returned data. The first error counter is coupled to the memory channel controller for counting errors in response to the count signal, and provides a control signal, for example a machine check architecture (MCA) exception, in response to reaching a predetermined state. The MCA exception allows another agent such as a data processor running post-package repair firmware to perform a post-package repair operation.

In yet another form, data access requests received from a host interface are converted to corresponding memory accesses provided to a memory interface. Returned data is provided to the host interface in response to responses received from the memory interface, wherein the responses comprise the returned data and a plurality of error correcting code (ECC) bits. A memory system is scrubbed for errors according to the returned data and the plurality of ECC bits, and correctable errors are repaired. A post package repair operation is performed on the memory system in response to a predetermined number of errors in a region of the memory system during the scrubbing.

FIG. 1 illustrates in block diagram form a data processing system 100 according to some embodiments. Data processing system 100 includes generally a data processor 110 in the form of an accelerated processing unit (APU), a memory system 120, a peripheral component interconnect express (PCIe) system 150, a universal serial bus (USB) system 160, and a disk drive 170. Data processor 110 operates as the central processing unit (CPU) of data processing system 100 and provides various buses and interfaces useful in modern computer systems. These interfaces include two double data rate (DDRx) memory channels, a PCIe root complex for connection to a PCIe link, a USB controller for connection to a USB network, and an interface to a Serial Advanced Technology Attachment (SATA) mass storage device.

Memory system 120 includes a memory channel 130 and a memory channel 140. Memory channel 130 includes a set of dual inline memory modules (DIMMs) connected to a DDRx bus 132, including representative DIMMs 134, 136, and 138 that in this example correspond to separate ranks. Likewise memory channel 140 includes a set of DIMMs connected to a DDRx bus 142, including representative DIMMs 144, 146, and 148.

PCIe system 150 includes a PCIe switch 152 connected to the PCIe root complex in data processor 110, a PCIe device 154, a PCIe device 156, and a PCIe device 158. PCIe device 156 in turn is connected to a system basic input/output system (BIOS) memory 157. System BIOS memory 157 can be any of a variety of non-volatile memory types, such as read-only memory (ROM), flash electrically erasable programmable ROM (EEPROM), and the like.

USB system 160 includes a USB hub 162 connected to a USB master in data processor 110, and representative USB devices 164, 166, and 168 each connected to USB hub 162. USB devices 164, 166, and 168 could be devices such as a keyboard, a mouse, a flash EEPROM port, and the like.

Disk drive 170 is connected to data processor 110 over a SATA bus and provides mass storage for the operating system, application programs, application files, and the like.

Data processing system 100 is suitable for use in modern computing applications by providing a memory channel 130 and a memory channel 140. Each of memory channels 130 and 140 can connect to state-of-the-art DDR memories such as DDR version four (DDR4), low power DDR4 (LPDDR4), graphics DDR version five (gDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Figure 2:
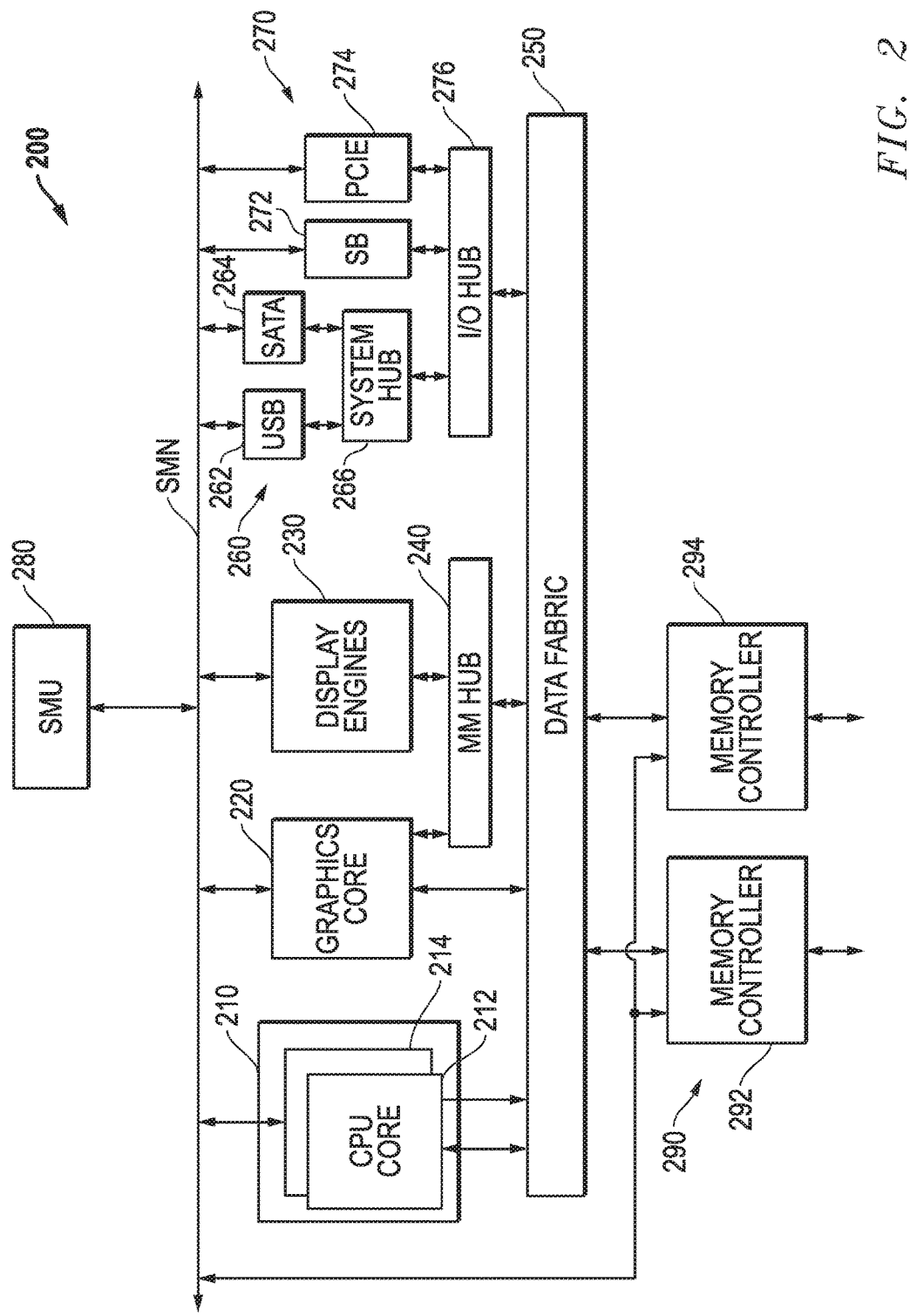
FIG. 2 illustrates in block diagram form an accelerated processing unit (APU) suitable for use in the data processing system of FIG. 1.

FIG. 2 illustrates in block diagram form an APU 200 suitable for use in data processing system 100 of FIG. 1. APU 200 includes generally a central processing unit (CPU) core complex 210, a graphics core 220, a set of display engines 230, a memory management hub 240, a data fabric 250, a set of peripheral controllers 260, a set of peripheral bus controllers 270, a system management unit (SMU) 280, and a set of memory controllers 290.

CPU core complex 210 includes a CPU core 212 and a CPU core 214. In this example, CPU core complex 210 includes two CPU cores, but in other embodiments CPU core complex can include an arbitrary number of CPU cores. Each of CPU cores 212 and 214 is bidirectionally connected to a system management network (SMN), which forms a control fabric, and to data fabric 250, and is capable of providing memory access requests to data fabric 250. Each of CPU cores 212 and 214 may be unitary cores, or may further be a core complex with two or more unitary cores sharing certain resources such as caches.

Graphics core 220 is a high performance graphics processing unit (GPU) capable of performing graphics operations such as vertex processing, fragment processing, shading, texture blending, and the like in a highly integrated and parallel fashion. Graphics core 220 is bidirectionally connected to the SMN and to data fabric 250, and is capable of providing memory access requests to data fabric 250. In this regard, APU 200 may either support a unified memory architecture in which CPU core complex 210 and graphics core 220 share the same memory space, or a memory architecture in which CPU core complex 210 and graphics core 220 share a portion of the memory space, while graphics core 220 also uses a private graphics memory not accessible by CPU core complex 210.

Display engines 230 render and rasterize objects generated by graphics core 220 for display on a monitor. Graphics core 220 and display engines 230 are bidirectionally connected to a common memory management hub 240 for uniform translation into appropriate addresses in memory system 120, and memory management hub 240 is bidirectionally connected to data fabric 250 for generating such memory accesses and receiving read data returned from the memory system.

Data fabric 250 includes a crossbar switch for routing memory access requests and memory responses between any memory accessing agent and memory controllers 290. It also includes a system memory map, defined by BIOS, for determining destinations of memory accesses based on the system configuration, as well as buffers for each virtual connection.

Peripheral controllers 260 include a USB controller 262 and a SATA interface controller 264, each of which is bidirectionally connected to a system hub 266 and to the SMN bus. These two controllers are merely exemplary of peripheral controllers that may be used in APU 200.

Peripheral bus controllers 270 include a system controller or "Southbridge" (SB) 272 and a PCIe controller 274, each of which is bidirectionally connected to an input/output (I/O) hub 276 and to the SMN bus. I/O hub 276 is also bidirectionally connected to system hub 266 and to data fabric 250. Thus for example a CPU core can program registers in USB controller 262, SATA interface controller 264, SB 272, or PCIe controller 274 through accesses that data fabric 250 routes through I/O hub 276.

SMU 280 is a local controller that controls the operation of the resources on APU 200 and synchronizes communication among them. SMU 280 manages power-up sequencing of the various processors on APU 200 and controls multiple off-chip devices via reset, enable and other signals. SMU 280 includes one or more clock sources not shown in FIG. 2, such as a phase locked loop (PLL), to provide clock signals for each of the components of APU 200. SMU 280 also manages power for the various processors and other functional blocks, and may receive measured power consumption values from CPU cores 212 and 214 and graphics core 220 to determine appropriate power states.

APU 200 also implements various system monitoring and power saving functions. In particular one system monitoring function is thermal monitoring. For example, if APU 200 becomes hot, then SMU 280 can reduce the frequency and voltage of CPU cores 212 and 214 and/or graphics core 220. If APU 200 becomes too hot, then it can be shut down entirely. Thermal events can also be received from external sensors by SMU 280 via the SMN bus, and SMU 280 can reduce the clock frequency and/or power supply voltage in response.

Figure 3:
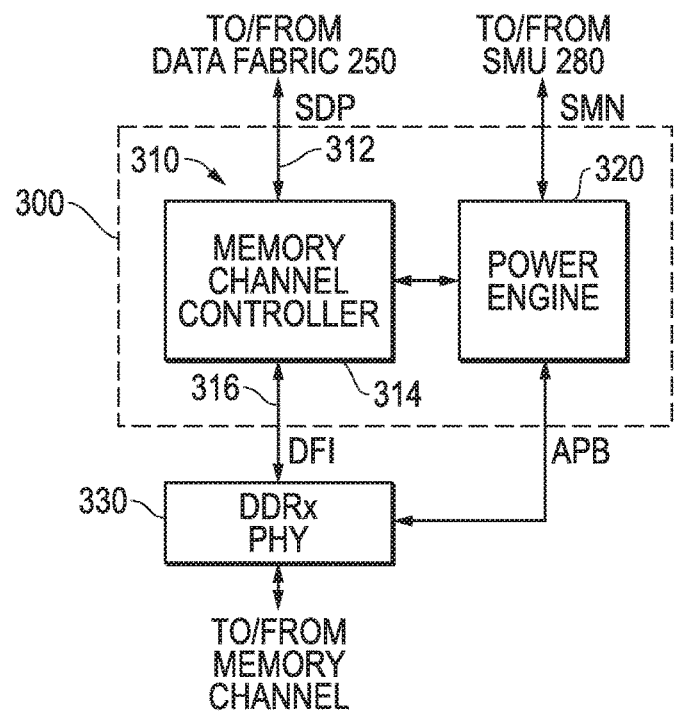
FIG. 3 illustrates in block diagram form a memory controller and associated physical interface (PHY) suitable for use in the APU of FIG. 2 according to some embodiments.

FIG. 3 illustrates in block diagram form a memory controller 300 and an associated physical interface (PHY) 330 suitable for use in APU 200 of FIG. 2 according to some embodiments. Memory controller 300 includes a memory channel 310 and a power engine 320. Memory channel 310 includes a host interface 312, a memory channel controller 314, and a physical interface 316. Host interface 312 bidirectionally connects memory channel controller 314 to data fabric 250 over a scalable data port (SDP). Physical interface 316 bidirectionally connects memory channel controller 314 to PHY 330 over a bus that conforms to the DDR-PHY Interface Specification (DFI). Power engine 320 is bidirectionally connected to SMU 280 over the SMN bus, to PHY 330 over the Advanced Peripheral Bus (APB), and is also bidirectionally connected to memory channel controller 314. PHY 330 has a bidirectional connection to a memory channel such as memory channel 130 or memory channel 140 of FIG. 1. Memory controller 300 is an instantiation of a memory controller for a single memory channel using a single memory channel controller 314, and has a power engine 320 to control operation of memory channel controller 314 in a manner that will be described further below.

Figure 4:
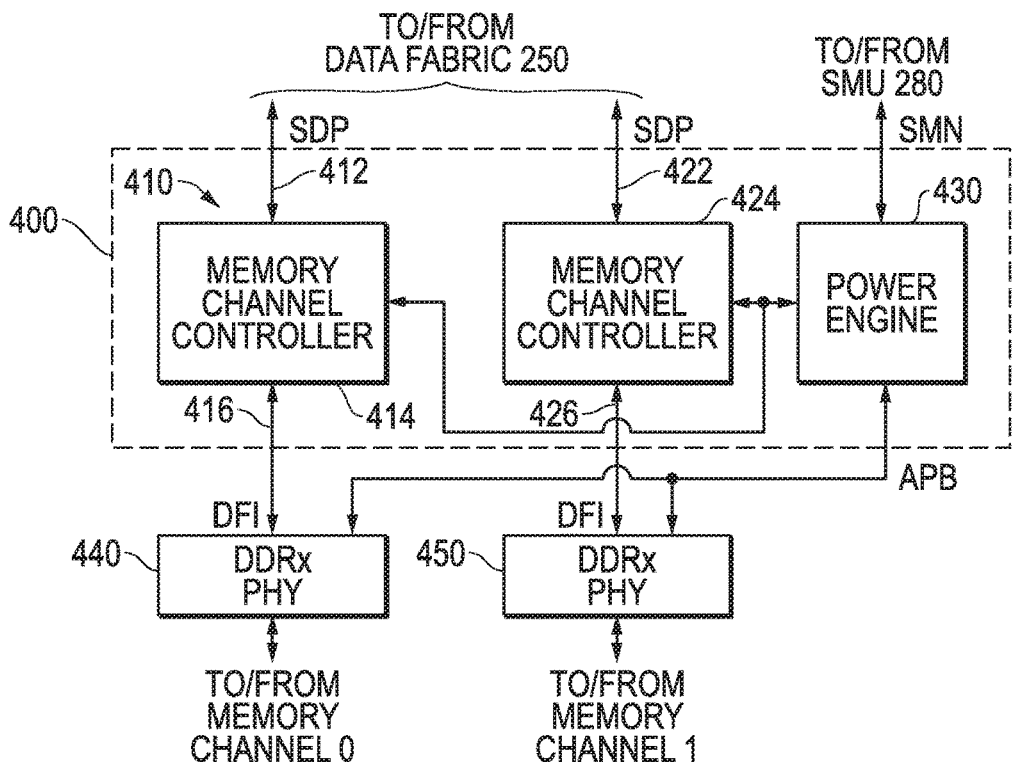
FIG. 4. illustrates in block diagram form another memory controller and associated PHY suitable for use in the APU of FIG. 2 according to some embodiments.

FIG. 4 illustrates in block diagram form another memory controller 400 and associated PHYs 440 and 450 suitable for use in APU 200 of FIG. 2 according to some embodiments. Memory controller 400 includes memory channels 410 and 420 and a power engine 430. Memory channel 410 includes a host interface 412, a memory channel controller 414, and a physical interface 416 Host interface 412 bidirectionally connects memory channel controller 414 to data fabric 250 over an SDP. Physical interface 416 bidirectionally connects memory channel controller 414 to PHY 440, and conforms to the DFI Specification. Memory channel 420 includes a host interface 422, a memory channel controller 424, and a physical interface 426. Host interface 422 bidirectionally connects memory channel controller 424 to data fabric 250 over another SDP. Physical interface 426 bidirectionally connects memory channel controller 424 to PHY 450, and conforms to the DFI Specification. Power engine 430 is bidirectionally connected to SMU 280 over the SMN bus, to PHYs 440 and 450 over the APB, and is also bidirectionally connected to memory channel controllers 414 and 424. PHY 440 has a bidirectional connection to a memory channel such as memory channel 130 of FIG. 1. PHY 450 has a bidirectional connection to a memory channel such as memory channel 140 of FIG. 1. Memory controller 400 is an instantiation of a memory controller having two memory channel controllers and uses a shared power engine 430 to control operation of both memory channel controller 414 and memory channel controller 424 in a manner that will be described further below.

Figure 5:
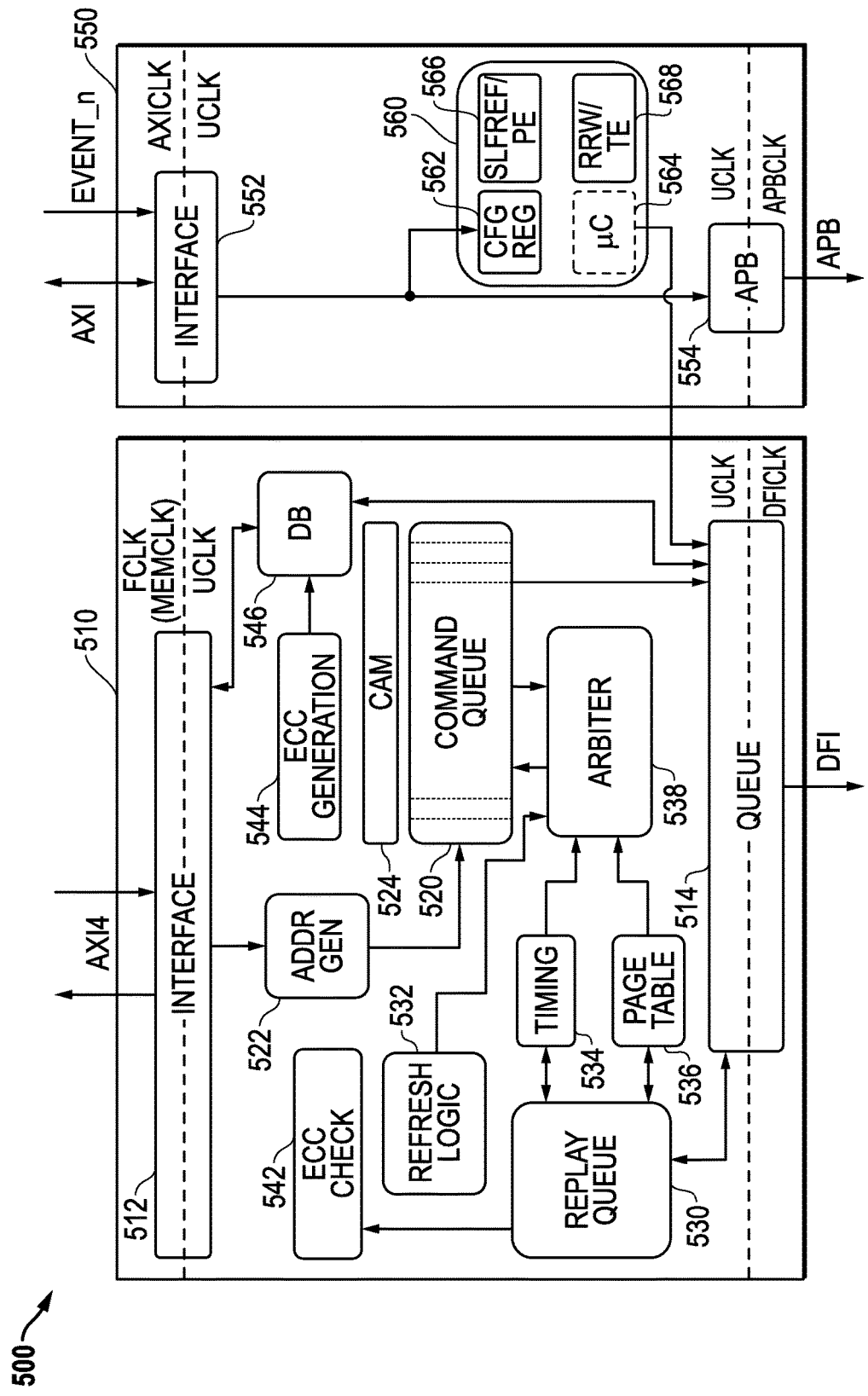
FIG. 5 illustrates in block diagram form a memory controller according to some embodiments.

FIG. 5 illustrates in block diagram form a memory controller 500 according to some embodiments. Memory controller 500 includes generally a memory channel controller 510 and a power controller 550. Memory channel controller 510 includes generally an interface 512, a queue 514, a command queue 520, an address generator 522, a content addressable memory (CAM) 524, a replay queue 530, a refresh logic block 532, a timing block 534, a page table 536, an arbiter 538, an error correction code (ECC) check block 542, an ECC generation block 544, and a data buffer (DB) 546.

Interface 512 has a first bidirectional connection to data fabric 250 over an external bus, and has an output. In memory controller 500, this external bus is compatible with the advanced extensible interface version four specified by ARM Holdings, PLC of Cambridge, England, known as "AXI4", but can be other types of interfaces in other embodiments. Interface 512 translates memory access requests from a first clock domain known as the FCLK (or MEMCLK) domain to a second clock domain internal to memory controller 500 known as the UCLK domain. Similarly, queue 514 provides memory accesses from the UCLK domain to the DFICLK domain associated with the DFI interface.

Address generator 522 decodes addresses of memory access requests received from data fabric 250 over the AXI4 bus. The memory access requests include access addresses in the physical address space represented in a normalized format. Address generator 522 converts the normalized addresses into a format that can be used to address the actual memory devices in memory system 120, as well as to efficiently schedule related accesses. This format includes a region identifier that associates the memory access request with a particular rank, a row address, a column address, a bank address, and a bank group. On startup, the system BIOS queries the memory devices in memory, system 120 to determine their size and configuration, and programs a set of configuration registers associated with address generator 522. Address generator 522 uses the configuration stored in the configuration registers to translate the normalized addresses into the appropriate format. Command queue 520 is a queue of memory access requests received from the memory accessing agents in data processing system 100, such as CPU cores 212 and 214 and graphics core 220. Command queue 520 stores the address fields decoded by address generator 522 as well other address information that allows arbiter 538 to select memory accesses efficiently, including access type and quality of service (QoS) identifiers. CAM 524 includes information to enforce ordering rules, such as write after write (WAW) and read after write (RAW) ordering rules.

Replay queue 530 is a temporary queue for storing memory accesses picked by arbiter 538 that are awaiting responses, such as address and command parity responses, write cyclic redundancy check (CRC) responses for DDR4 DRAM or write and read CRC responses for gDDR5 DRAM. Replay queue 530 accesses ECC check block 542 to determine whether the returned ECC is correct or indicates an error. Replay queue 530 allows the accesses to be replayed in the case of a parity or CRC error of one of these cycles.

Refresh logic 532 includes state machines for various powerdown, refresh, and termination resistance (ZQ) calibration cycles that are generated separate from normal read and write memory access requests received from memory accessing agents. For example, if a memory rank is in precharge powerdown, it must be periodically awakened to run refresh cycles. Refresh logic 532 generates refresh commands periodically to prevent data errors caused by leaking of charge off storage capacitors of memory cells in DRAM chips. In addition, refresh logic 532 periodically calibrates ZQ to prevent mismatch in on-die termination resistance due to thermal changes in the system.

Arbiter 538 is bidirectionally connected to command queue 520 and is the heart of memory channel controller 510. It improves efficiency by intelligent scheduling of accesses to improve the usage of the memory bus. Arbiter 538 uses timing block 534 to enforce proper timing relationships by determining whether certain accesses in command queue 520 are eligible for issuance based on DRAM timing parameters. For example, each DRAM has a minimum specified time between activate commands, known as "$t_{RC}$". Timing block 534 maintains a set of counters that determine eligibility based on this and other timing parameters specified in the JEDEC specification, and is bidirectionally connected to replay queue 530. Page table 536 maintains state information about active pages in each bank and rank of the memory channel for arbiter 538, and is bidirectionally connected to replay queue 530.

In response to write memory access requests received from interface 512, ECC generation block 544 computes an ECC according to the write data. DB 546 stores the write data and ECC for received memory access requests. It outputs the combined write data/ECC to queue 514 when arbiter 538 picks the corresponding write access for dispatch to the memory channel.

Power controller 550 generally includes an interface 552 to an advanced extensible interface, version one (AXI), an APB interface 554, and a power engine 560. Interface 552 has a first bidirectional connection to the SMN, which includes an input for receiving an event signal labeled "EVENT_n" shown separately in FIG. 5, and an output. APB interface 554 has an input connected to the output of interface 552, and an output for connection to a PHY over an APB. Power engine 560 has an input connected to the output of interface 552, and an output connected to an input of queue 514. Power engine 560 includes a set of configuration registers 562, a microcontroller (μC) 564, a self refresh controller (SLFREF/PE) 566, and a reliable read/write timing engine (RRW/TE) 568. Configuration registers 562 are programmed over the AXI bus, and store configuration information to control the operation of various blocks in memory controller 500. Accordingly, configuration registers 562 have outputs connected to these blocks that are not shown in detail in FIG. 5. Self refresh controller 566 is an engine that allows the manual generation of refreshes in addition to the automatic generation of refreshes by refresh logic 532. Reliable read/write timing engine 568 provides a continuous memory access stream to memory or I/O devices for such purposes as DDR interface maximum read latency (MRL) training and loopback testing.

Memory channel controller 510 includes circuitry that allows it to pick memory accesses for dispatch to the associated memory channel. In order to make the desired arbitration decisions, address generator 522 decodes the address information into predecoded information including rank, row address, column address, bank address, and bank group in the memory system, and command queue 520 stores the predecoded information. Configuration registers 562 store configuration information to determine how address generator 522 decodes the received address information. Arbiter 538 uses the decoded address information, timing eligibility information indicated by timing block 534, and active page information indicated by page table 536 to efficiently schedule memory accesses while observing other criteria such as QoS requirements. For example, arbiter 538 implements a preference for accesses to open pages to avoid the overhead of precharge and activation commands required to change memory pages, and hides overhead accesses to one bank by interleaving them with read and write accesses to another bank. In particular during normal operation, arbiter 538 normally keeps pages open in different banks until they are required to be precharged prior to selecting a different page.

Figure 6:
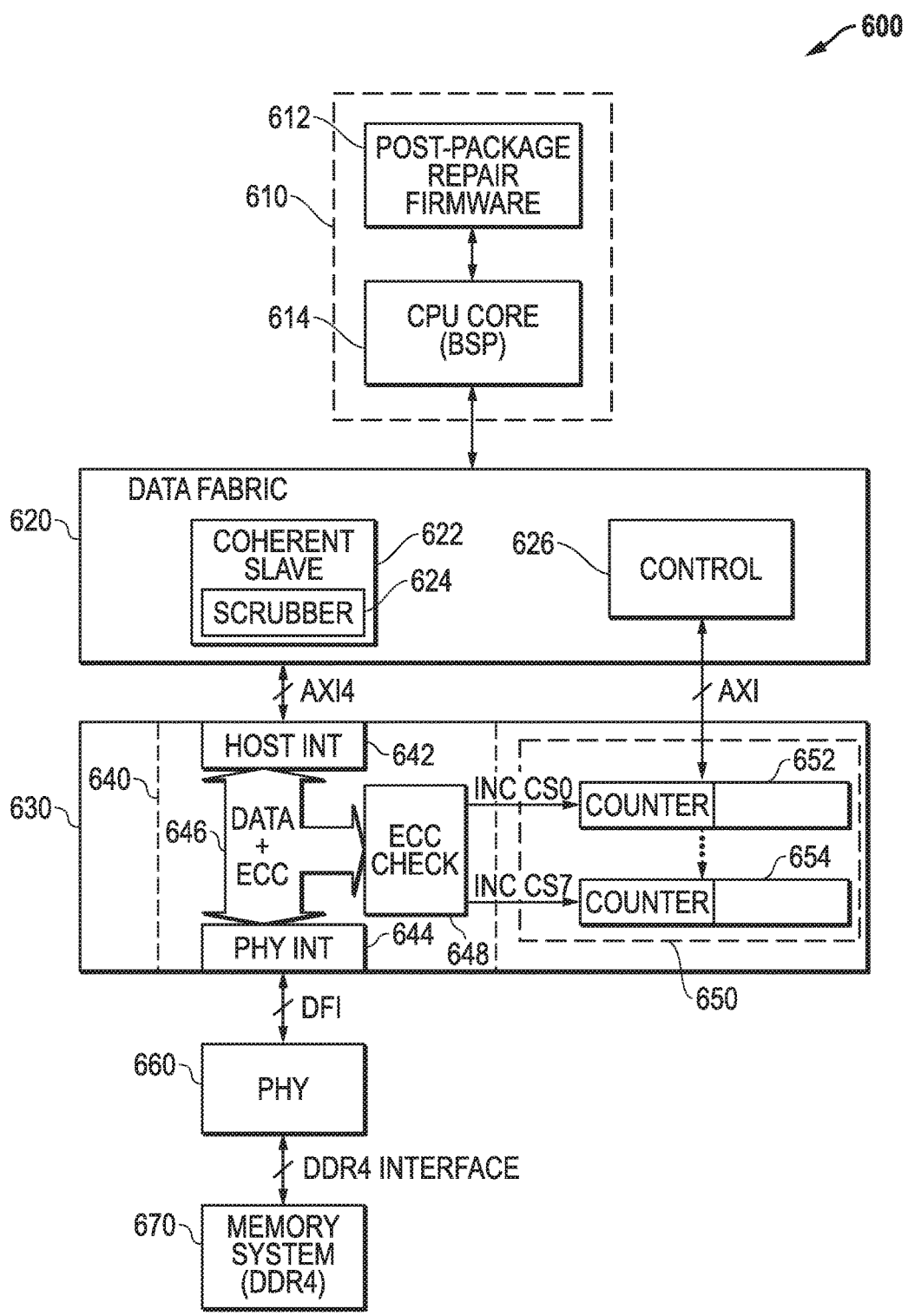
FIG. 6 illustrates in block diagram form a data processing system with integral post-package repair according to some embodiments.

FIG. 6 illustrates in block diagram form a data processing system 600 with integral post-package repair according to some embodiments. Data processing system 600 includes generally a data processor 610, a data fabric 620, a memory controller 630, a PHY 660, and a memory system 670. Data processor 610 includes a memory 612 that stores post-package repair firmware and a CPU core 614. Memory 612 corresponds to system BIOS 157 of FIG. 1, whereas CPU core 614 corresponds to a CPU core of CPU core complex 210, such as CPU core 212 or CPU core 214. In the multi-core architecture of FIG. 1, one of the CPU cores is known as the BIOS service processor (BSP) and is connected to system BIOS 157. In data processor 610 CPU core 614 is the BSP and is bidirectionally connected to memory 612 to read and execute the BIOS instructions including the post-package repair firmware. CPU core 614 is also bidirectionally connected to data fabric 620 to issue read and write commands to and receive read responses from the memory system, and to issue and respond to probes between itself and other CPU cores complexes for shared data that may be stored in an internal cache of one of the CPU cores.

Data fabric 620 includes a coherent slave 622 and a control block 626. Coherent slave 622 is an engine responsive to read and write requests to generate accesses and provide the accesses to an appropriate memory controller, such as memory controller 630. Coherent slave 622 also includes a scrubber 624. Scrubber 624 is a hardware state machine that is used to perform a scrubbing operation by cycling through memory addresses for each location in memory, including each bank of each memory chip and each rank of memory chips in the system. In the scrubbing operation, coherent slave 622 issues read-modify-write cycles to successive locations in memory system 670 so that memory errors can be detected and in the case of some errors corrected. Control block 626, on the other hand, keeps track of reported errors, signals machine check interrupts for uncorrectable memory errors. Control block 626 also signals CPU core 614 of the need to perform a post-package repair operation using the post-package repair stored in memory 612.

Memory controller 630 may be implemented using memory controller 500 of FIG. 5. However memory controller 630 as shown in FIG. 6 includes only those portions of a memory controller that are used to implement memory error detection, correction, and post-package repair determination. As shown memory controller 630 includes a memory channel controller 640 and a power engine 650. Memory channel controller 640 includes a host interface 642, a PHY interface 644, an internal data path 646, and an ECC check circuit 648. Internal data path 646 is used to conduct data and ECC signals and internally connects host interface 642, PHY interface 644, and ECC check circuit 648. Host interface 642 has a bidirectional port connected to the AXI4 bus, and a bidirectional port for connection to internal data path 646. PHY interface 644 has a bidirectional port connected to internal data path 646, and a bidirectional port for connection to the DFI bus. ECC check circuit 648 has bidirectional port connected to internal data path 646, and a set of eight outputs of which FIG. 6 shows two representative outputs labeled "INC_CS0" and "INC_CS7" corresponding to rank 0 and rank 7, respectively. Power engine 650 includes a set of eight counters including representative counters 652 and 654 receiving respective ones of signals INC_CS0 and INC_CS7 and corresponding to rank 0 and rank 7, respectively. Each counter has an output for providing a counter overflow signal over the AXI bus to control block 626 in data fabric 620.

PHY 660 has a bidirectional port connected to memory controller 630 over the DFI bus, and a bidirectional port connected to a memory interface labeled "DDR4 Interface" for connection to a memory system 670. PHY 660 can be implemented as described above with respect to DDRx PHY 330 of FIG. 3 as well as DDRx PHYs 440 and 450 of FIG. 5.

Memory system 670 is a DDR4 memory system and is connected to PHY 660 over a DDR4 interface. DDR4 memory supports post-package repair and thus interacts with data processing system 600 in a manner that will be described in greater detail below.

In operation, data processing system 600 uses available resources to efficiently perform memory reliability checking, repair of correctable ECC errors, reporting of uncorrectable ECC errors, and post-package repair. It also leverages background scrubbing operations to detect hard errors and to use the post-package repair feature of some DRAMs, such as DDR4 DRAMs, to correct them before an uncorrectable error occurs.

Data processing system 600 efficiently distributes the post-package detection and correction task among data processor 610, data fabric 620, and memory controller 630. Data fabric 620 includes a scrubber 624 to perform background scrubbing of all memory locations in memory system 670. Since scrubbing is a low bandwidth background operation, a single scrubber can be used in conjunction with multiple memory controllers to scrub the entire memory space with only a small amount of circuit area.

Scrubber 624 has two modes of operation. First, it has a control mode during which it performs background scrubbing. Background scrubbing in the control mode involves reading each memory location to determine whether there is an ECC error. If there is no ECC error for a particular memory location, then scrubber 624 rewrites the data before it continues to read the subsequent memory location in the memory space. In one embodiment, scrubber 624 rewrites the data regardless of whether a correctable ECC error is detected because some DRAMs implement on-chip ECC, and the subsequent write cycle ensures that a correctable ECC error, that was detected but corrected in the DRAM and therefore not seen by scrubber 624, will cause the updated data to be rewritten to the page buffer. Then on a subsequent precharge command, the corrected data will be written to the memory array to correct the error. If there were no subsequent write operation, however, the error would never be corrected in the memory array. In an alternative embodiment, scrubber 624 performs a read cycle but only rewrites the data on a detected error. If scrubber 624 detects a correctable error, then it reports the error as a machine check architecture (MCA) exception.

Scrubber 624 scrubs all memory locations in memory system 670 at a certain rate. For example, it may follow the rule of performing a scrub of all memory locations once per day. In the illustrated embodiment, scrubber 624 reads memory locations having a size equal to a cache line of a CPU core, typically 64 bytes, which can be efficiently read from memory system 670 in a single burst using a burst of length 8. Thus it includes a 64-byte buffer as well as ECC detection and correction circuitry. However in other embodiments scrubber 624 can read memory locations of various other sizes such as a region or a page.

Second, scrubber 624 has a redirect mode. As noted above in response to a system access encountering an ECC error, scrubber 624 reports the error to the system BIOS. For example a common ECC mechanism for DDRx DIMMs supports single bit error detection and correction and multiple bit error detection. The ECC error may have been caused by an alpha particle changing the contents of a single memory cell, and thus represents a random error that does not need to be permanently corrected. In response to reporting a correctable ECC error, system BIOS redirects scrubber 624 to perform a read-write operation of the memory location. If however scrubber 624 detects an uncorrectable error, such as a multiple-bit error, it also reports it using the MCA exception, allowing data processor 610 to take a different corrective action. For example the software error handler could stop the software application that was using the corrupt data, or reset data processor 610.

Scrubber 624 issues each read request to memory controller 630. Memory controller 630 issues the read request in an order determined according to normal operation arbitration. Upon receipt of the requested data, memory controller 630 performs its own ECC check and determines whether the calculated ECC matches the ECC returned from memory. If it does not detect an error, then scrubber 624 proceeds to the next memory location. If however it detects an error, it indicates the error to power engine 650 by activating an increment signal. Eventually if the error count value exceeds a threshold, then the counter reports an error to control block 626. Control block 626 then takes appropriate remedial action, which may include a post-package repair operation.

By integrating scrubber 624 into the post-package repair flow, data processing system 600 uses an existing circuit block to unlock the capabilities of the DDR4 post-package repair feature. By using copy and rewrite operations available in memory controller 630, it avoids the need for a large read/write buffer. For example with current memory organizations and densities, a row may be 8 kilobytes (kB) in size and performing this type of operation with read/write operations and a counter would require an 8 kB buffer to evaluate an entire row of memory. Scrubber 624 also allows the data to be migrated from a failing row as a background task that would already be taking place.

There are several advantages to this architecture. First, the architecture is efficient because it leverages background scrubbing that may already be available to detect and correct soft errors. Second, it uses a small amount of additional hardware, for example ECC check circuit 648 and the set of counters, to keep track of errors that may eventually trigger a post-package repair operation. Third, it uses counters capable of detecting a high rate of correctable errors and therefore to trigger a post-package repair operation before actual program failure or loss of data.

Figure 7:
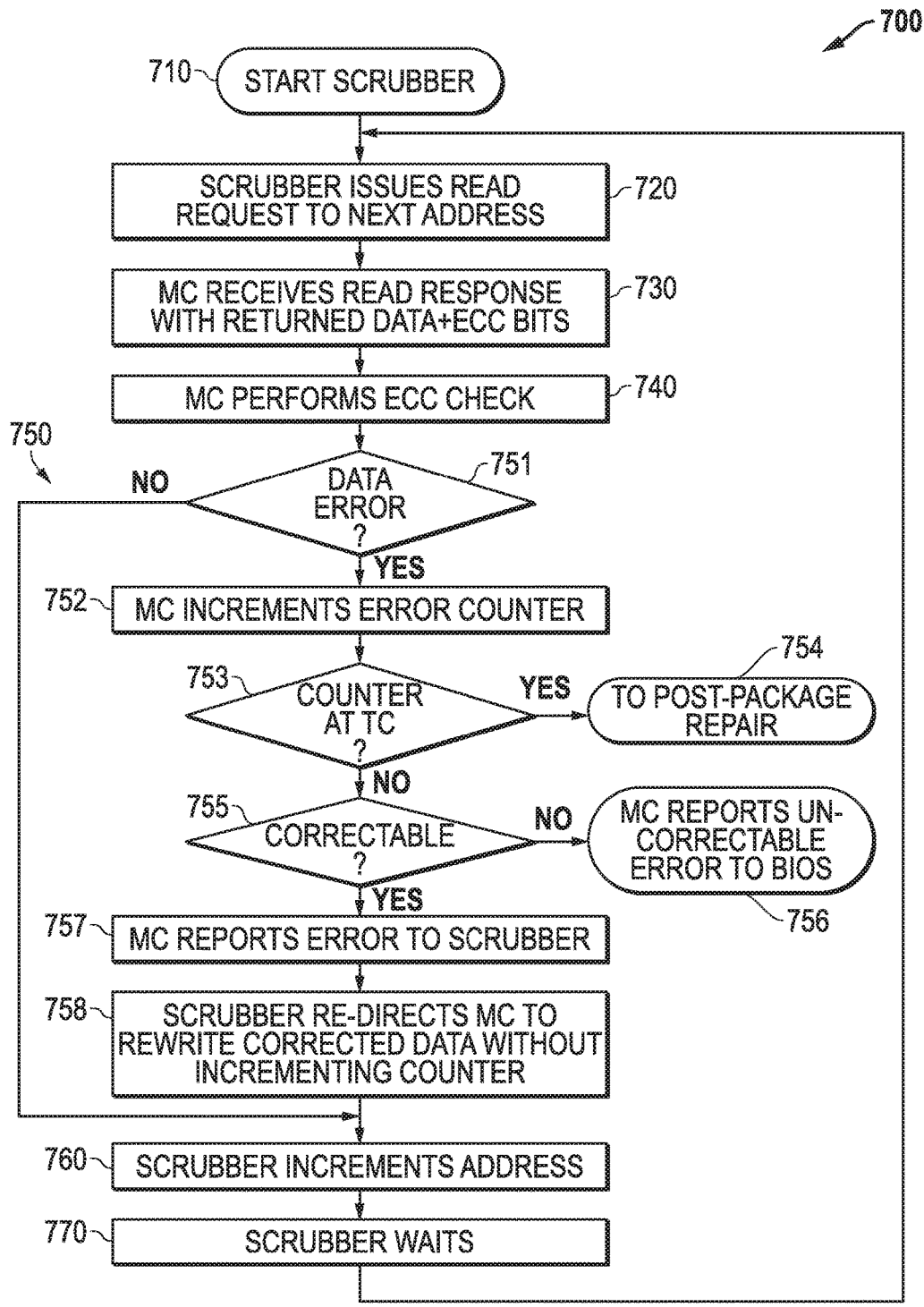
FIG. 7 illustrates a flow diagram of operations relevant to post-package repair in the data processing system of FIG. 6 according to some embodiments.

FIG. 7 illustrates a flow diagram 700 of operations relevant to post-package repair in data processing system 600 of FIG. 6 according to some embodiments. Operation starts in an action box 710 in which the system BIOS or the operating system starts scrubber 624, such as sometime after startup. In an action box 720, scrubber 624 issues a read request as part of a read-modify-write (RMW) cycle to the next address. In an action box 730, memory controller 630 receives a read response with returned read data and corresponding ECC bits. In an action box 740, memory controller 630 performs an ECC check on the data and the corresponding ECC bits using ECC check circuit 648. Flow then proceeds to a sub-flow 750.

In sub-flow 750, a decision box 751 determines whether ECC check circuit 648 detects a data error. If so, then at an action box 752 memory controller 630 increments an error counter. A decision box 753 determines whether the error counter has reached a terminal count. Detection of whether the counter has reached the terminal count can be implemented efficiently as an overflow bit for an incrementing counter, or an underflow bit for a pre-load and decrement counter. If the counter has reached the terminal count, then flow proceeds to a post-package repair sub-flow 754. If not, then flow proceeds to a decision box 755.

Decision box 755 determines whether the ECC error is correctable, e.g., whether it is a single-bit error. If not, then flow proceeds to an action box 756 in which memory controller 630 reports an uncorrectable error to the operating system through a machine check architecture (MCA) exception. Such an uncorrectable error will cause the operating system to take an appropriate action, such terminating the process or program, restarting the system, etc. If the error is correctable, then in an action box 757 memory controller 630 reports the error to scrubber 624. Then in an action box 758, scrubber 624 re-directs memory controller 630 to rewrite the corrected data without incrementing the counter.

In an action box 760, scrubber 624 increments its address in preparation for the next scrubbing cycle, then in an action box 770 scrubber 624 waits a period of time before returning flow to action box 720. In some embodiments, scrubber 624 is capable of scrubbing at a certain rate, such as the entire physical memory once per day, but the scrub rate can be accelerated, such as in response to a high level of errors.

Figure 8:
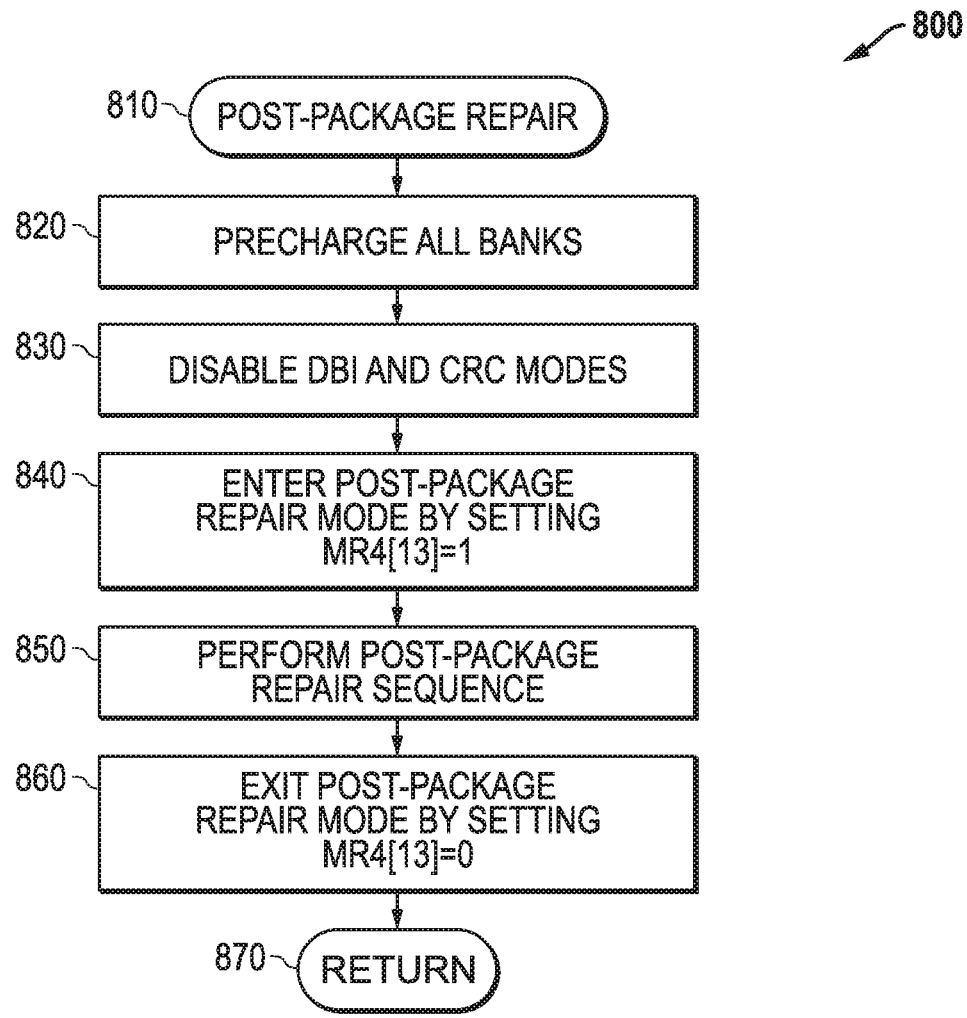
FIG. 8 illustrates a flow diagram of a post package repair routine according to some embodiments.

FIG. 8 illustrates a flow diagram 800 of a post package repair sub-flow according to some embodiments. Flow diagram 800 assumes that memory system 670 includes DDR4 DRAMs but a corresponding flow may be defined according to the operation described herein for a different DRAM that also supports post-package repair. Flow start in a box 810. In an action box 820, memory controller 630 precharges all banks of the affected memory chips, allowing their mode registers to be updated. In an action box 830, memory controller 630 disables the data bus inversion (DBI) and cyclic redundancy check (CRC) modes of the affected DRAMs by writing to certain mode register bits as defined by the DDR4 standard. In an action box 840, memory controller 630 causes the affected memory chips to enter the post-package repair mode by setting bit 13 of Mode Register 4 (MR4[13]) to 1. Note that between action boxes 830 and 840, some DRAMs require an extended unlock sequence before post-package repair can be enabled, to prevent a random software error from causing an inadvertent post-package repair operation. In an action box 850, the affected DRAM performs the post-package repair operation. In an action box 860, memory controller 630 causes the affected memory chips to exit the post-package repair mode by setting MR4[13] to 0. In an action box 870, flow returns to the main flow shown in flow diagram 700 and in particular to action box 760.

Thus the post package repair system provides enhanced system reliability efficiently. When the system determines that post package repair is necessary, it executes the post package repair selectively on DRAMs such that any error introduced during post package repair remains correctable by the system ECC code. A typical DRAM rank includes a 72-bit memory bus using 18 by-four (×4) DRAMs. System 600 has a ×4 "chipkill" correction code that allows the repair of one ×4 device at a time. Executing the post-package repair firmware will destroy the current contents of a corresponding page of a single ×4 DRAM. However after the post-package repair operation, these errors will remain correctable errors and can be corrected in-line during normal accesses to those memory locations without impact to the requestor. Thus the RMW accesses of scrubber 624 (either by redirect or periodic scrubbing) will regenerate the complete DRAM contents of ECC and data, including the bits destroyed by the ECC access. This operation takes place without the need for large buffers to keep copies of data in the DRAM being repaired or stalling memory accesses from requestors for long periods of time. In other embodiments, system 600 can implement scrubber 624 as system firmware or software as a routine executing on a processor that makes memory access requests.

The method of FIGS. 7 and 8 as well as some of the operations of data processing system 600 may be implemented with various combinations of hardware and software. For example the ECC checking can be done with hardware circuitry of in firmware running on a controller. Moreover while scrubber 624 was implemented as a hardware circuit residing in data fabric 620 in the illustrated embodiment, in other embodiments scrubber 624 can be a software engine implemented in system firmware or software. Some of the software components may be stored in a computer readable storage medium for execution by at least one processor. Moreover some or all of the method illustrated in FIGS. 7 and 8 may also be governed by instructions that are stored in a computer readable storage medium and that are executed by at least one processor. Each of the operations shown in FIGS. 7 and 8 may correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

Data processing system 600 of FIG. 6 or any portion thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the post-package repair operation was described in terms of DDR4 DRAM, but can be easily adapted for other memory that may currently exist or be specified in the future that supports post-package repair. Moreover while the background scrubber was conveniently placed in the data fabric so it could control multiple memory controllers, in other embodiments it could be in the memory controller instead. Moreover while the disclosed embodiment uses one extra ECC bit per byte to support single-bit detection and correction and multiple-bit detection, in other embodiments other ECC schemes using more bits and capable of detecting and correcting a larger number of bits can be used.

Accordingly, it is intended by the appended claims to cover all modifications of the disclosed embodiments that fall within the scope of the disclosed embodiments.

What is claimed is:

1. A post-package memory repair system comprising:
   a memory channel controller for converting data access requests received from a host interface to corresponding memory accesses provided to a dynamic random access memory (DRAM) memory interface, and providing returned data to said host interface in response to responses received from said memory interface, wherein said responses comprise returned data and a plurality of error correcting code (ECC) bits;
   a first error counter coupled to said memory channel controller for counting errors in said returned data, and providing a control signal in response to reaching a predetermined state;
   a background scrubber coupled to said memory channel controller for controlling said memory channel controller to read data sequentially and periodically from all memory locations of a memory system at a certain rate, and in response to detecting a correctable error, to rewrite corrected data; and
   a data processor coupled to said memory channel controller and responsive to said control signal to perform a post package repair operation with said memory system in response to said control signal.

2. The post-package memory repair system of claim 1 wherein said data processor comprises:
   a central processing unit (CPU) core coupled to said memory channel controller; and
   a firmware memory coupled to said CPU core for storing a plurality of instructions which, when executed by said CPU core, cause said CPU core to control said memory channel controller to perform said post package repair operation.

3. The post-package memory repair system of claim 2 wherein said firmware memory stores a basic input-output system (BIOS) and said plurality of instructions are part of said BIOS.

4. The post-package memory repair system of claim 2 wherein said data processor increases a scrub rate of said background scrubber in response to said memory channel controller detecting a predetermined level of errors.

5. The post-package memory repair system of claim 1 wherein:
   said background scrubber reads a data element from memory of a predetermined size less than a size of a corresponding row in said memory system; and
   said memory channel controller has a read/write buffer of said predetermined size for temporarily storing said data element.

6. The post-package memory repair system of claim 1 wherein said predetermined state is reached when said first error counter reaches a terminal count.

7. The post-package memory repair system of claim 1 wherein said memory channel controller comprises:
   an ECC check circuit responsive to said returned data and said plurality of ECC bits to detect an error in said returned data and to determine whether said error is correctable.

8. The post-package memory repair system of claim 7 further comprising:
   a plurality of additional error counters,
   wherein in response to detecting an ECC error in a memory access, said ECC check circuit further provides one of: a first increment signal to said first error counter, and a plurality of additional increment signals to a corresponding plurality of additional error counters selected according to a region of said memory access in said memory system.

9. The post-package memory repair system of claim 1 wherein said DRAM memory interface is adapted to be coupled to an interface compatible with the double data rate (DDR)-physical interface (DFI) Specification.

10. The post-package memory repair system of claim 1 wherein said background scrubber is implemented as a hardware circuit.

11. The post-package memory repair system of claim 1 wherein said background scrubber is implemented by software executing on said data processor.

12. A memory controller comprising:
   a memory channel controller for converting data access requests received from a host interface to corresponding memory accesses provided to a dynamic random access memory (DRAM) memory interface, and providing returned data to said host interface in response to responses received from said DRAM memory interface, wherein said responses comprise returned data and a plurality of error correcting code (ECC) bits;
   wherein said memory channel controller detects an error in said returned data by performing an error check based on said plurality of error correcting code (ECC) bits corresponding to said returned data, provides a first control signal in response to detecting said error in said returned data, and provides a count signal in response to detecting said error in said returned data is a correctable error; and
   a first error counter coupled to said memory channel controller for counting correctable errors in response to said count signal, and providing a second control signal in response to reaching a predetermined state.

13. The memory controller of claim 12 wherein said second control signal comprises a machine check architecture interrupt.

14. The memory controller of claim 12 wherein said memory channel controller comprises:
   an ECC check circuit responsive to said returned data and said plurality of ECC bits to detect said error in said returned data and to determine whether said error is correctable.

15. The memory controller of claim 14 further comprising:
   a plurality of additional error counters,
   wherein said ECC check circuit further provides a selected one of said count signal to said first error counter and a plurality of additional increment signals to a corresponding plurality of additional error counters in response to detecting an ECC error in a memory access, wherein said selected one is selected for said memory access according to a region of said memory access in a memory system.

16. The memory controller of claim 12 wherein said DRAM memory interface is adapted to be coupled to an interface compatible with the double data rate (DDR)-physical interface (DFI) Specification.

17. A method comprising:
   converting data access requests received from a host interface to corresponding memory accesses provided to a dynamic random access memory (DRAM) memory interface;
   providing returned data to said host interface in response to responses received from said DRAM memory interface, wherein said responses comprise said returned data and a plurality of error correcting code (ECC) bits;
   background scrubbing all memory locations of a memory system periodically at a certain rate for errors according to said returned data and said plurality of ECC bits, and repairing correctable errors; and
   performing a post package repair operation on said memory system in response to a predetermined number of errors in a region of said memory system during said background scrubbing.

18. The method of claim 17 wherein said converting comprises:
   storing said data access requests in a queue; and
   arbitrating among a plurality of data access requests stored in said queue to provide said memory accesses at times determined by predetermined criteria.

19. The method of claim 17 wherein said background scrubbing comprises:
   providing a read command to a next address in said memory system;
   receiving said response from said memory system;
   performing an ECC check according to said returned data and said plurality of ECC bits; and
   incrementing an error counter if said performing said ECC check indicates an error.

20. The method of claim 19 further comprising:
   performing said post package repair operation on said memory system in response to said error counter reaching a terminal count.

21. The method of claim 17 wherein said background scrubbing comprises:
   periodically and sequentially scrubbing each address in said memory system for said correctable errors.

22. The method of claim 17 further comprising:
   detecting a non-correctable error; and
   reporting said non-correctable error to a basic input-output system (BIOS).

* * * * *